United States Patent [19]

Toda et al.

[11] Patent Number: 4,935,285

[45] Date of Patent: Jun. 19, 1990

[54] CERAMIC SUBSTRATES FOR MICROELECTRONIC CIRCUITS AND PROCESS FOR PRODUCING SAME

[75] Inventors: Gyozo Toda, Hino; Takashi Kuroki, Yokohama; Shousaku Ishihara, Kamakura; Naoya Kanda; Tsuyoshi Fujita, both of Yokohama, all of Japan

[73] Assignee: Hitachi, Ltd., Tokyo, Japan

[21] Appl. No.: 280,346

[22] Filed: Dec. 6, 1988

Related U.S. Application Data

[62] Division of Ser. No. 847,302, Apr. 2, 1986.

[30] Foreign Application Priority Data

Apr. 5, 1985 [JP] Japan .................................. 60-70864

[51] Int. Cl.$^5$ ................................................ B32B 3/00
[52] U.S. Cl. .................................... 428/137; 428/138; 428/209; 428/426; 428/432; 428/457; 428/901; 174/256; 361/397; 361/414; 501/119; 501/128
[58] Field of Search ............... 428/137, 138, 209, 426, 428/432, 457, 901; 174/68.5; 361/397, 414; 501/119, 128

[56] References Cited

U.S. PATENT DOCUMENTS

| | | | |
|---|---|---|---|
| 4,272,500 | 6/1981 | Eggerding et al. | 501/70 |
| 4,736,276 | 4/1988 | Ushifusa et al. | 361/414 |
| 4,817,276 | 4/1989 | Toda et al. | 501/119 |

FOREIGN PATENT DOCUMENTS 0172382 7/1984 European Pat. Off. .
0196670 4/1985 European Pat. Off. .

OTHER PUBLICATIONS

Amer. Cer. Soc. Bull., May 1984, Preparation and Properties of Mullite Cordierite Composites, Mussler et al., pp. 705–710.

*Primary Examiner*—Patrick Ryan
*Attorney, Agent, or Firm*—Antonelli, Terry & Wands

[57] ABSTRACT

A ceramic substrate for densely integrated semiconductor arrays which is superior in a coefficient of thermal expansion, dielectric constant, strength of metallized bond, and mechanical strength, comprising a sintered body composed essentially of mullite crystals and a non-crystralline binder composed of $SiO_2$, $Al_2O_3$, and MgO, is provided.

4 Claims, 8 Drawing Sheets

×1000

×1000

CERAMIC SUBSTRATES FOR MICROELECTRONIC CIRCUITS AND PROCESS FOR PRODUCING SAME

BACKGROUND OF THE INVENTION

This is a division of application Ser. No 847,302, filed Apr. 2, 1986.

The present invention relates to ceramic substrates for microelectronic circuits and to a process for producing the substrates. More particularly, the invention is directed to a ceramic substrate having a specially low dielectric constant, low coefficient of thermal expansion and high mechanical strength and permitting wiring thereon with a high-melting metallic conductor, and to a process for producing such ceramic substrates.

In recent years, with the increasing integration degree of semiconductor devices, there are growing needs for circuit substrates supporting such devices to accept higher-density wiring and to have higher performance characteristics, higher reliability, and so forth. In particular, subjects important to circuit substrates for use in electronic computers and the like are high-speed signal propagation and high reliability. For these substrates, there are used, in practice, ceramics composed mainly of alumina ($Al_2O_3$).

Desired characteristics of the ceramic to be used for such circuit substrates are generally as follows:

(1) The ceramic insulator is dense and has a hermetic nature. This matter relates to the overall reliability of the circuit substrate.

(2) The coefficient of thermal expansion of the ceramic is as close as possible to that of silicon chips. This is for the purpose of minimizing strain which will develop at the junction between the ceramic substrate and the silicon chip to prolong the joint life and enhance the reliability.

(3) The dielectric constant of the ceramic is minimized. This is for speed-up of the signal propagation.

(4) Junction of conductor metals to the ceramic substrate is strong, that is, the metallized bond strength is high. This relates to the bond strength between the circuit substrate and the output or input terminal.

(5) The ceramic has a high mechanical strength. This is necessary for handling in the process for fabricating the substrate and for mounting onto a sealing means and a cooling means to the substrate.

Thus the material to be used for the circuit substrates should satisfy the above requirements simultaneously. In particular, circuit substrates each loaded with several tens densely integrated semiconductor components for use in electronic computers will be inapplicable practically if any one of the above items is not satisfied.

Conventionally $Al_2O_3$ is used for substrates of this type. Although it is satisfactory in hermetic nature, metallized bond strength and mechanical strength, it has a higher coefficient of thermal expansion of $8 \times 10^{-6}/°C.$ than that of silicon chips ($3 \times 10^{-6}/°C.$) and also has a high dielectric constant of about 10. Accordingly, $Al_2O_3$ is not suitable for circuit substrates.

Known ceramic insulators having a lower coefficient of thermal expansion and dielectric constant than that of $Al_2O_3$ include silica ($SiO_2$, $\epsilon=$ca. 4), cordierite crystal ($5SiO_2.2Al_2O_3.2MgO$, $\epsilon=$ca. 5.0), cordierite glass ($\epsilon=6.3$), steatite ($MgO.SiO_2$, $\epsilon=6.3$), forsterite ($2MgO.SiO_2$, $\epsilon=6.5$), and mullite ($3Al_2O_3.2SiO_2$, $\epsilon=7$).

However, the coefficient of thermal expansion of $SiO_2$ and cordierite crystal are very low, i.e., as low as $5 \times 10^{-7}/°C.$ and $1.5 \times 10^{-6}/°C.$, respectively and those of steatite and forsterite are 7.2 and 9.8 (room temperature $-400°$ C.), respectively, which are nearly equal and higher than that of $Al_2O_3$. The coefficient of thermal expansion of cordierite glass is about $3.7 \times 10^{-6}/°C.$, which is close to that of silicon chips, but the mechanical strength of cordierite glass is as low as 100 MPa, so that the cordierite glass is impractical for circuit substrate purposes.

Mullite is somewhat unsatisfactory in dielectric constant and coefficient of thermal expansion, but it has a high mechanical strength of 350 MPa, which is thus most promising among the conventional ceramics.

However, mullite has the following inherent problems (1) and (2):

(1) Bond strength between mullite and a usual conductor metal is markedly low. This is because no chemical reaction occurs between mullite and either tungsten (W) or molybdenum (Mo), which is used commonly as a conductor metal on alumina substrates and the like, even at elevated temperatures. This property is inherent in mullite.

(2) Highly strengthening of the above-mentioned bond requires a special powder of mullite and a special sintering method which are impractical as well as expensive. That is, K. S. Mazdiyasni and L. M. Brown ["Synthesis and Mechanical Properties of Stoichiometric Aluminum Silicate (Mullite)", J. Am. Ceramic Soc., 55[11], 548–555 (1972)] obtained a sintered mullite body capable of forming a high strength by compacting a fine powder of mullite and sintering the compacted body at a temperature as high as 1800° C.

It is very difficult, however, to form such a powder in green sheets (before sintering), which are preforms of circuit substrates. Moreover, the sintering temperature of 1800° C. is much higher than those used for usual substrates, e.g., 1500° to 1650° C. This is a significant bottleneck in practicing this method in view of also the heating elements and heat insulator of the furnace.

While mullite is inherently hard to sinter, as described above, there has long been used a method referred to as "liquid phase sintering" which has been reduced into practice for producing sintered hard alloys.

The typical sintered hard alloy is composed of tungsten carbide (WC) and cobalt (Co). Although WC is difficult to sinter in single form, it can be made into a high-density sintered body when burned jointly with several percentages of cobalt. This is because cobalt is melted in the sintering step and the melted cobalt draws WC in the solid phase thereto by the surface tension thereof.

This liquid phase sintering method is also applied to the sintering of $Al_2O_3$ for producing circuit substrates therefrom. That is, usual $Al_2O_3$ particles of several $\mu m$ in size are hard to sinter, but they can be densely sintered according to the liquid phase sintering mechanism by addition of a material (an eutectic composition of three or four components such as $SiO_2$, $Al_2O_3$, $MgO$, and $CaO$) fusible at a far lower temperature than is $Al_2O_3$.

In the above two examples, both cobalt and the three- or four-component eutectic composition, which generate a liquid phase, play the role of promoting the sintering of a hardly sinterable substance. Nevertheless, the former is called a binder and the latter a sintering aid, in general.

The reason for the above is as follows: In the case of the WC-Co sintered hard alloy, WC crystal grains are strongly bonded together through metallic cobalt, and the high hardness and high toughness of this alloy can be altered optionally with the combination of hard and brittle WC and tough cobalt. Thus the binder function of cobalt is very effective.

In the case of the $Al_2O_3$ circuit substrate, the sintering of $Al_2O_3$ can be greatly promoted by addition of the three- or four-component eutectic composition, but the original properties of $Al_2O_3$ are scarcely varied by this addition. Therefore, the three- or four-component eutectic composition is generally called a sintering aid.

From the above described point of view, studies of sintering aids for mullite have been made for the purpose of solving difficulties in sintering mullite ceramics. Of course, these studies are all intended to make denser the texture of mullite according to the liquid phase sintering mechanism by using cordierite as another sintering aid.

For instance, in Japanese Patent Laid-Open No. 139709/80 and in "Preparation and Properties of Mullite-Cordierite Composites" [B. H. Mussler and M. W. Shafer, Am. Ceram. Soc. Bull., 63, 705 (1984)], discussion is given on the use of mullite as a matrix and cordierite as a sintering aid.

From the equilibrium diagram of the $SiO_2$-$Al_2O_3$-$MgO$ system, it can be seen that the melting point of $5SiO_2.2Al_2O_3.2MgO$ is 1490° C., which is far lower than the melting point (1830° C.) of mullite. Thus the mullite texture has been made denser by the liquid phase sintering action, yielding a sintered body of zero % water absorption.

While the sintering aid used in Japanese Patent Laid-Open No. 139709/80 and the B. H. Mussler et al article are equally referred to as cordierite, it is not clear from the former whether the cordierite is crystalline or amorphous, and B. H. Mussler et al use crystalline cordierite.

Cordierite either in a crystalline or amorphous form has a lower coefficient of thermal expansion and a lower dielectric constant than those of mullite as stated above. Accordingly, it is expected that the addition of cordierite to mullite will lower the coefficient of thermal expansion and dielectric constant of mullite as well as produce the sintering promoting effect.

In the Laid-Open No. 139709/80, a sintered body having a coefficient of thermal expansion ranging from $4.2 \times 10^{-6}$ to $3.8 \times 10^{-6}$/°C. and dielectric constant ranging from 6.7 to 6.5 is obtained when the proportion of cordierite to mullite is altered from 3.63 to 36.2% by weight.

In the Laid-Open No. 139709/80, while cordierite is incorporated into a mullite crystal matrix, the composition range within which the above-mentioned characteristics are obtained is expressed in terms of MgO, $Al_2O_3+SiO_2$, and the weight ratio of $Al_2O_3/SiO_2$. Such expression of composition is obviously inappropriate for sintered bodies made denser by the liquid phase sintering mechanism and for sintered bodies all the characteristics of which are dependent on $Al_2O_3$ crystal matrix It is reasonable to express the compositions of sintered mullite-cordierite bodies in terms of the proportion of cordierite to mullite.

According to the article of B. H. Mussler et al., sintered bodies having a coefficient of thermal expansion ranging from $4.5 \times 10^{-6}$ to $3.2 \times 10^{-6}$/°C. and dielectric constant ranging from 5.7 to 4.8 are obtained when the proportion of crystalline cordierite to mullite is altered from 17.1 to 76.8% by weight.

In the two prior art examples described above, the obtained sintered bodies, when used for circuit substrates, are nearly satisfactory in air tightness, coefficient of thermal expansion and dielectric constant.

The mechanical strength of ceramics, that is, one of the characteristics required for circuit substrates is not described in the two prior art examples. Hence, it is doubtful whether these prior art ceramics are satisfactory in strength when used as circuit substrates.

Moreover, no result of investigation on metallized bond strength is described in the prior art examples. Simultaneous aggregative sintering of a conductor metal with an insulator ceramics is indispensable particularly for fabricating multilayer circuits comprising a number of substrates. Nevertheless, no description is given on the metallized bond strength in the prior art examples. It is a fatal matter in using these ceramics for circuit substrates if the metallized bonds thereof are weak.

The reason for giving no result about the metallized bond strength in the prior art examples may be that the sintering aids used in the examples have fundamental defects which affect the metallizing of mullite substrates.

Since mullite does not react chemically with any of such high-melting metals as W and Mo, the liquid phase penetration method that is applied to $Al_2O_3$ substrates and the like is indispensable in order to join firmly such metals with mullite.

SUMMARY OF THE INVENTION

It is an object of the invention to provide a ceramic circuit substrate which can overcome the above noted drawbacks of the prior art, has a dense texture, coefficient of thermal expansion closest to that of silicon, sufficiently lower dielectric constant than that of $Al_2O_3$, and high mechanical strength and can be joined firmly to such high-melting metals as W and Mo.

It is another object of the invention to provide a process for producing such ceramic substrates.

The present invention is based on the finding of a novel binder for sintering mullite which is satisfactory in any of the compacting action based on the liquid phase sintering mechanism, improvements of ceramics in properties, and strong joining of ceramics to conductor metals by the liquid phase penetrating action.

DETAILED DESCRIPTION OF THE PREFERRED EMBODIMENTS

The basic concept of the present invention will be described below. The binder to be used in the present invention needs to meet the following requirements:

(1) In order to sinter mullite densely by the liquid phase sintering mechanism, the melting point of the binder should be lower than that of mullite chemical reaction should occur slightly between mullite and the binder at suitable sintering temperatures, and mullite crystal grains should be wetted sufficiently by the molten binder.

(2) In order to join a conductor metal to mullite by the liquid phase penetrating action, the binder in a molten form mentioned in (1) above should wet sufficiently the conductor metal.

(3) Similarly to the cobalt in the WC-Co alloy, the binder should have effects of improving mullite in properties such as a coefficient of thermal expansion, dielectric constant, and mechanical strength.

To summarize the above requirements, the binder to be used in mullite-based circuit substrates needs to have a sufficiently lower melting point than does mullite, the binder in a molten form should wet sufficiently the conductor metal and mullite crystal grains, and the binder should contain much $SiO_2$, in other words, the matrix of the binder should be $SiO_2$ which, among heat-resistant inorganic simple materials, has the lowest coefficient of thermal expansion and dielectric constant.

Figure 1A:
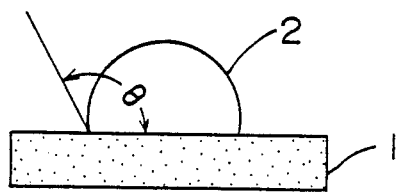
FIG. 1 illustrates the ability of a liquid to wet a solid.
Figure 1B:
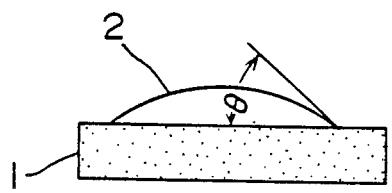

Now description is given on the wettability, which has an important connection with the present invention. FIG. 1 illustrates shapes of molten droplets 2 placed separately on solid plates 1. In the figure, $\theta$ is called contact angle. At $\theta > 90°$ (FIG. 1(a)), it is said that the plate is not wetted, and at $\theta < 90°$ (FIG. 1(b)) it is said that the plate is wetted. For the present invention, the conductor metals and mullite crystal grains correspond to the solid plates, and the binder corresponds to the molten droplets, in FIG. 1.

Generally, in order to densify a solid by the liquid phase sintering, the condition of $\theta \simeq 90°$ is insufficient and the condition of $\theta \leq 50°$ is usually required. In consequence, the binder to be used for mullite circuit substrates is desired to exhibit $\theta \leq 50°$ is usually required. In consequence, the binder to be used for mullite circuit substrates is desired to exhibit $\theta < 50°$.

The present invention is illustrated in more detail with reference to the following examples.

EXAMPLE 1

Figure 2:
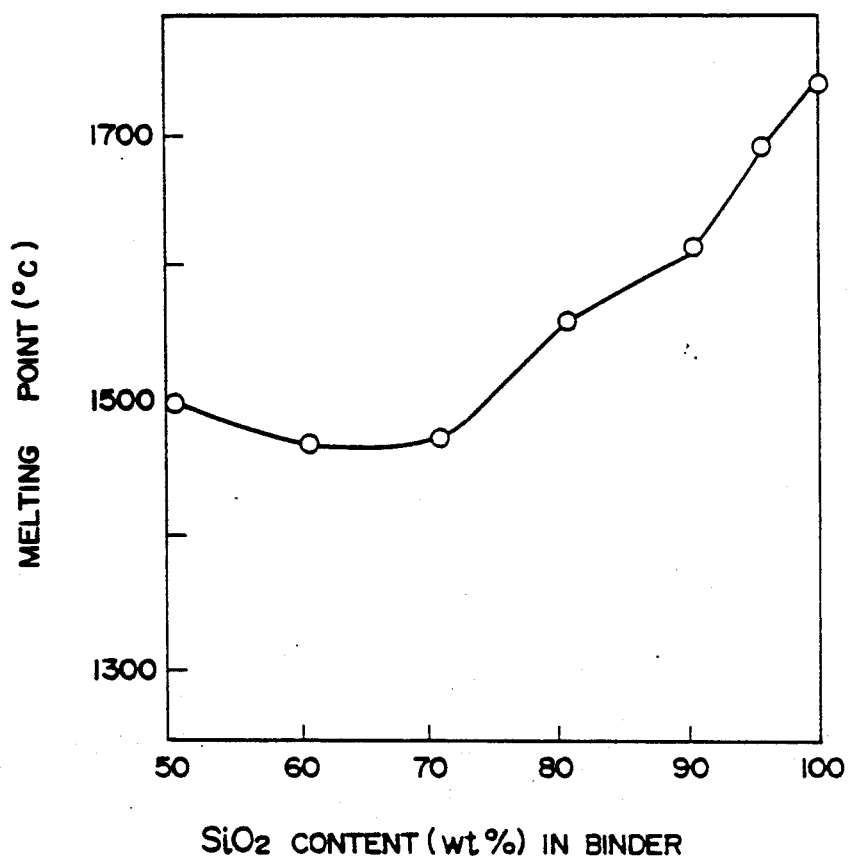
FIG. 2 shows the relation of a $SiO_2$ content in binder to a melting point of binder.

FIG. 2 shows the relation of melting point to $SiO_2$ content (wt %) measured on the binder compositions according to the present invention for use in mullite circuit substrates. For the purpose of lowering the coefficient of thermal expansion and dielectric constant of mullite by addition of a binder, the $SiO_2$ content in the binder must be at least 50% by weight, but with a 100% $SiO_2$ content a melting point is 1740° C., which is too high to sinter materials for circuit substrates. Hence the binder of 100% $SiO_2$ is impractical.

The principle of melting point depression by addition of second and third elements to $SiO_2$ is utilized for the purpose of maintaining at least 50% $SiO_2$ content in a binder and putting the melting point of the binder within the usual sintering temperature range of 1550° to 1770° C. for circuit substrates metallizable with tungsten or molybdenum.

In view of the above, binders were prepared by altering the $SiO_2$ content from 50 to 90 wt. %, as shown in FIG. 2, the $Al_2O_3$ content from 35 to 4 wt. %, and the MgO content from 15 to 1 wt. %.

Figure 3:
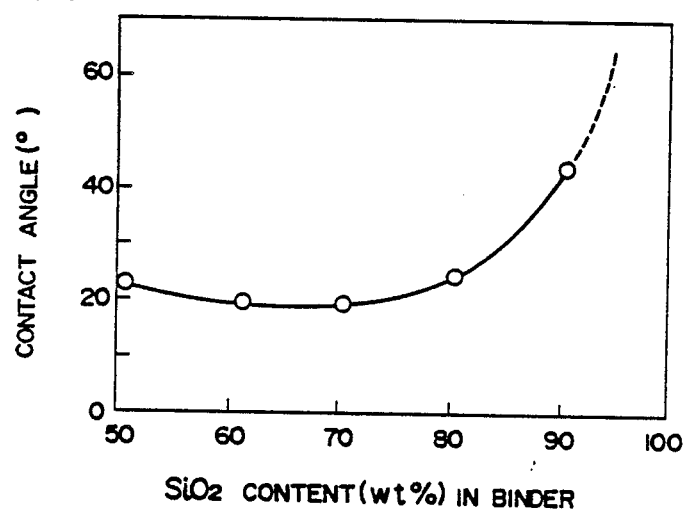
FIG. 3 shows the relation of a $SiO_2$ content in binder to a binder contact angle on mullite.

Binders of these compositions were heated to 1650° C., droplets of the resulting molten binders were placed on plates of mullite sintered in a single form, and the contact angles were measured. Results thereof are shown in FIG. 3. The contact angles are up to 50° so far as the $SiO_2$ content in each binder lies in the range of 50 to 90 wt. %.

Further, droplets of the molten binders were placed on molybdenum and tungsten metal plates and the contact angles were measured. Results thereof are shown in FIG. 4, wherein curve 1 is on molybdenum and curve 2 on tungsten.

Figure 4:
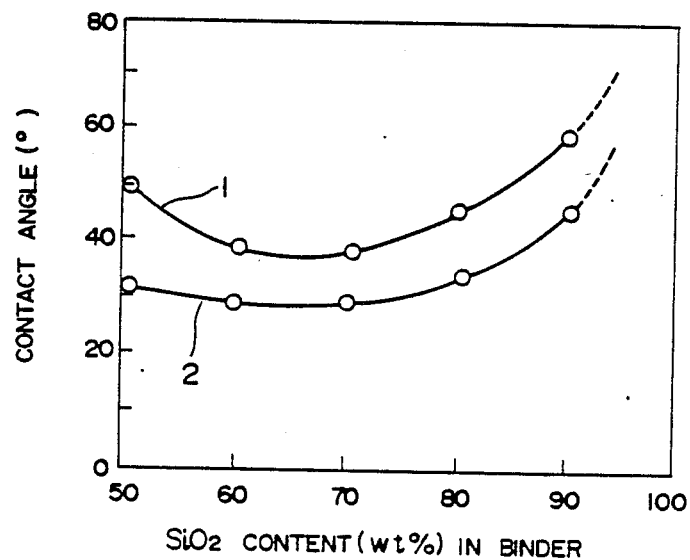
FIG. 4 shows the relation of a $SiO_2$ content in binder to a binder contact angle on each of W and Mo.

Comparing the results shown in FIGS. 2, 3, and 4 with the foregoing requirements for the binder to be used in mullite circuit substrates, it can be seen that among the binder compositions shown in FIG. 2, those containing 50 to 90 wt. % of $SiO_2$ exhibit contact angles of up to 50° on mullite and on molybdenum and tungsten metals at sintering temperatures of 1550° to 1660° C. The contact angle of a binder is desired to be as small as possible when the binder is used for sintering mullite, tungsten, or molybdenum. Therefore, it is concluded from FIGS. 3 and 4 that the preferred range of $SiO_2$ contents in the binder is from 60 to 80 wt. %.

Figure 5:
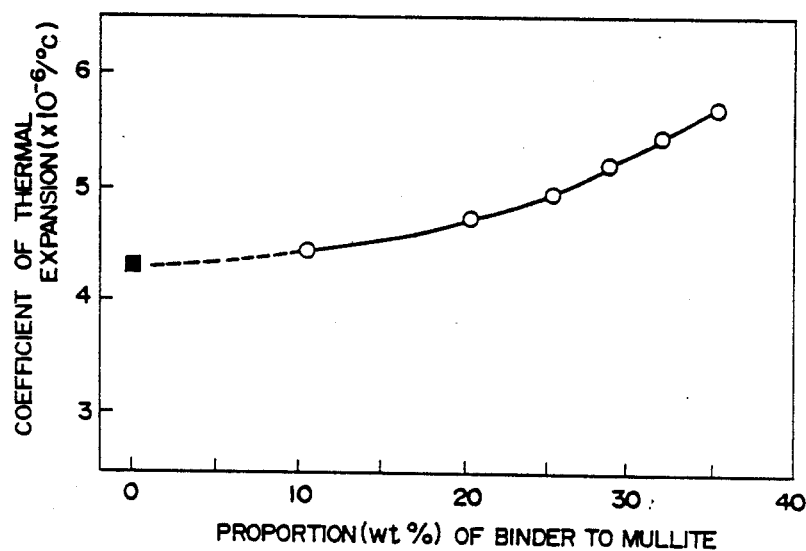
FIG. 5 shows the relation of a binder-to-mullite proportion to a coefficient of thermal expansion of mullite-binder sintered composition.

In the next place, FIG. 5 shows coefficients of thermal expansion (room temperature - 500° C.) of mullite-binder sintered compositions, the coefficients having a great influence on the junction between the resulting circuit substrates and silicon chips. The coefficients of thermal expansion shown in FIG. 5 were of sintered bodies prepared by mixing mullite with various proportions of a binder having a definite composition ($SiO_2$ 90 wt. %, $Al_2O_3$ 7.0 wt. %, MgO 3.0 wt. %) and sintering the mixtures at 1620° C. for 1 hour. From FIG. 5, desirable proportions of the binder to mullite are found to be from 10 to 30 wt. %.

As is clear from the above, the coefficient of thermal expansion increases with the proportion of the binder to mullite. The coefficient of the sintered body containing no binder was measured by K. S. Mazdiyasni and L. M. Brown. Such a change in coefficient of thermal expansion as shown in FIG. 5 is due to the larger coefficient of the binder than that of mullite.

It is known that the coefficient of thermal expansion of a substance generally depends on the composition and crystal structure of the substance and the coefficient of thermal expansion of a substance in a noncrystalline or amorphous form is larger than that of the substance in a crystalline form. Examination revealed that the binder used in the above-mentioned measurement of a coefficient of thermal expansion was noncrystalline and microscopically in a glass state. From these facts it may be said that binders used in the present invention are noncrystalline.

Then, coefficients of thermal expansion were measured similarly but by altering the binder composition in the range shown in FIG. 2 while constantly maintaining the mullite-to-binder ratio within a range of 75:25. The results indicated that the coefficient of thermal expansion decreased from $5.7 \times 10^{-6}/°C$. to $4.8 \times 10^{-6}/°C$. as the $SiO_2$ content was increased.

According to the prior art example, i.e., Japanese Patent Laid-Open No. 139709/80, the coefficient of thermal expansion of mullite is decreased greatly by adding cordierite as a sintering aid. This is considered to result from the extremely smaller coefficient of thermal expansion of crystalline cordierite, used as the sintering aid, than that of mullite.

It can be seen from the foregoing that the coefficient of thermal expansion of the ceramics according to the present invention is much smaller than that of the prior art $Al_2O_3$ substrate and hence very effective in enhancing the reliability of junction between the circuit substrate and the Si chip.

Figure 6:
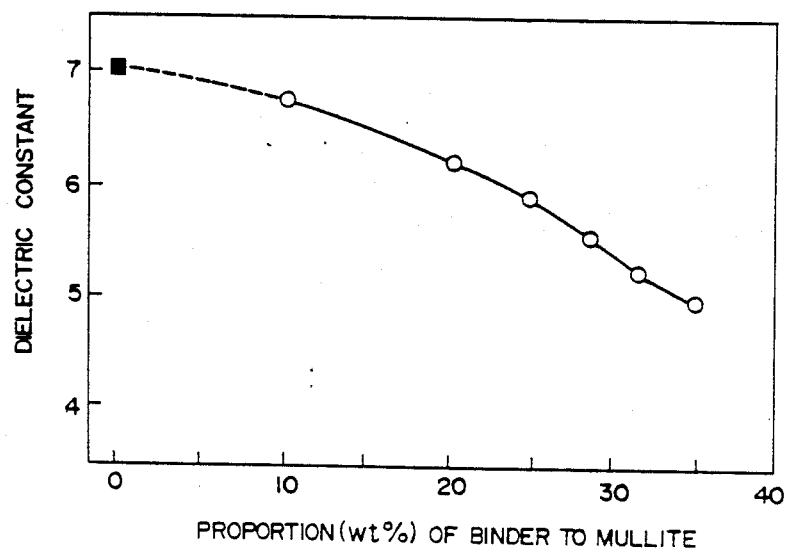
FIG. 6 shows the relation of a binder-to-mullite proportion to a dielectric constant of mullite-binder sintered composition.
Figure 7:
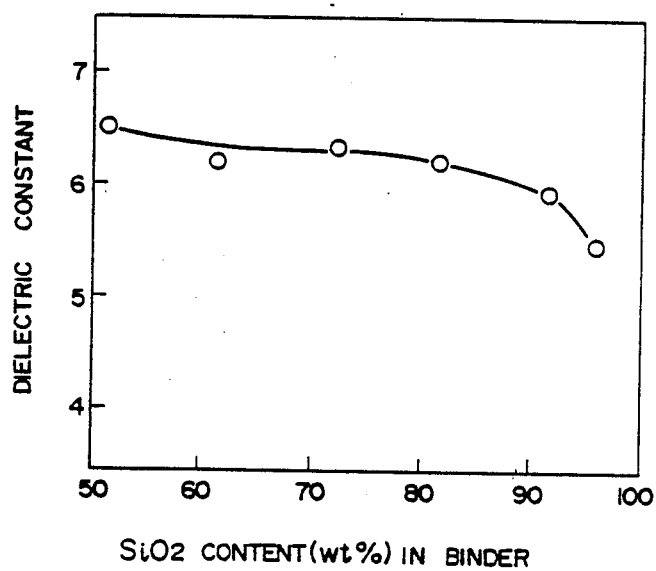
FIG. 7 shows the relation of a $SiO_2$ content in binder to a dielectric constant of mullite-binder sintered composition.

FIG. 6 shows the measurements of dielectric constants (1 MHz) for the same mullite-binder sintered compositions as used in FIG. 5. FIG. 7 shows results of mullite-binder sintered compositions prepared by altering the binder composition as shown in FIG. 2 while constantly maintaining the mullite-to-binder ratio within a range of 75/25. From FIG. 6 it seems that desirable binder-to-mullite proportions minimize the dielectric constant; however, suitable values of said proportions are from 10 to 30 wt. % in consideration of the balance between the dielectric constant and other properties of the sintered product. While desirable binder compositions selected from FIG. 7 also seems to lower the dielectric constant, suitable $SiO_2$ contents for binders are from 60 to 90 wt. %. In this composition range, the dielectric constant is stable without notable variation.

As shown in FIGS. 6 and 7, the dielectric constant decreases greatly from the original value of mullite as the binder proportion and the $SiO_2$ content in binders are increased. Of the dielectric constant values in FIG. 6, that of the composition containing no binder is measured by K. S. Mazdiyasni and L. M. Brown.

The effect of binders in ceramic substrates of the present invention, outlined above, is slightly inferior on the coefficient of thermal expansion and dielectric constant of ceramics to the effect of sintering aid used in the two prior art examples mentioned before. This is because the present invention employs noncrystalline binders while the prior art examples employ crystalline sintering aids.

However, these slightly reduced coefficient of thermal expansion and dielectric constant do not matter in overall consideration of characteristics required for circuit substrates. That is, the most important subjects for putting a ceramic circuit substrate into practical use are the mechanical strength of the ceramic substrate and the bond strength between the ceramic substrate and the conductor metal, which are described below.

Figure 8:
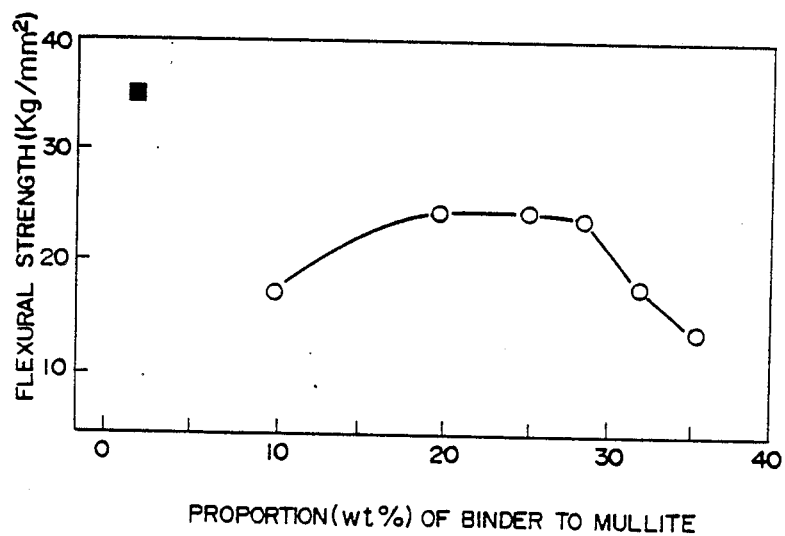
FIG. 8 shows the relation of a binder-to-mullite proportion to a flexural strength of mullite-binder sintered composition.
Figure 9:
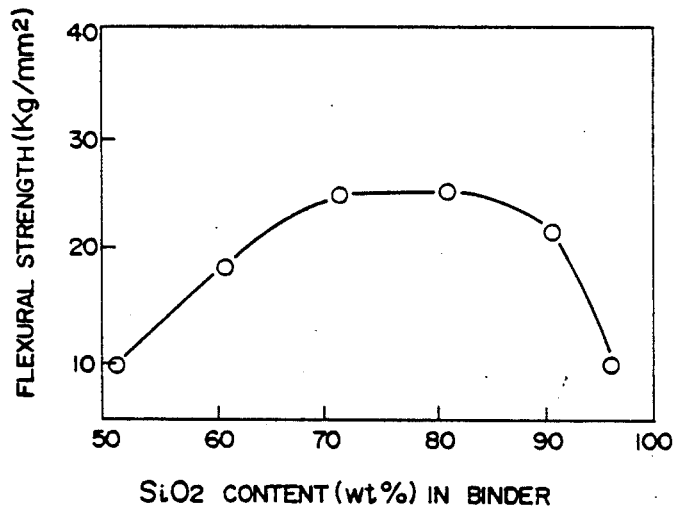
FIG. 9 shows the relation of a $SiO_2$ content in binder to a flexural strength of mullite-binder sintered composition.

FIG. 8 shows the results of three-point bending tests for flexural strength, which is one of the characteristics required for circuit substrates, on the same samples as in FIG. 5. FIG. 9 shows the results of the above-mentioned bending tests on the same samples as in FIG. 7. Ceramics having flexural strengths of at least 15 kg/mm², which is necessary for circuit substrates, are found from FIG. 8 to have binder-to-mullite proportions of 10 to 35 wt. %, preferably 15 to 30 wt. %, and are bound from FIG. 9 to have $SiO_2$ contents of 50 to 95 wt. %, preferably 65 to 90 wt. %, in each binder.

Decrease, as shown in FIG. 8, in flexural strength when the binder proportion exceeds 30 wt. % seems to be caused by the lower strength of the binder itself than that of mullite. Also decrease, as shown in FIG. 9, in flexural strength when the $SiO_2$ content in each binder exceeds 90 wt. %, seems to be caused by the inhibition of mullite compaction by the increased amounts of $SiO_2$.

Figure 10:
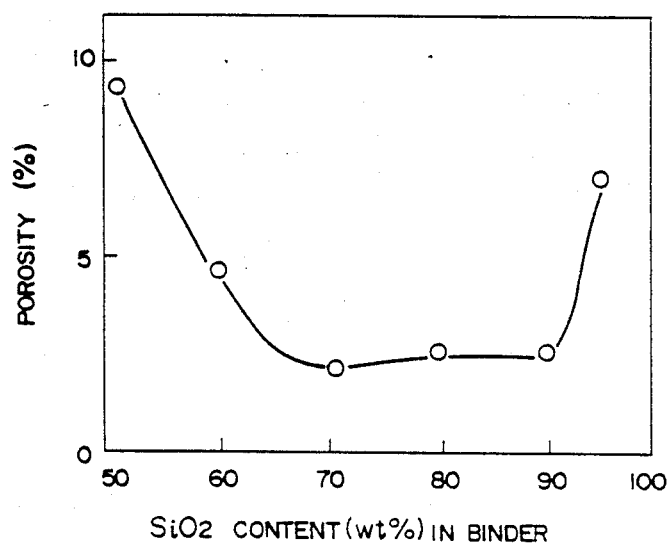
FIG. 10 shows the relation of a $SiO_2$ content in binder to a porosity of mullite-binder sintered composition.

One of the factors controlling the flexural strength of ceramics is insufficient compaction in sintering ceramics which leaves pores in sintered bodies. It is known that the strength of sintered bodies increases with decrease in the porosity thereof. FIG. 10 shows the porosities of the same samples as in FIG. 9. As is seen from FIG. 10, the porosity is up to 5% when the $SiO_2$ content in each binder ranges from 60 to 90 wt. %; these results are well consistent with the flexural strengths I shown in FIG. 9. Thus, the desirable range of $SiO_2$ contents is from 65 to 90 wt. %. Of course, the ceramics according to the present invention are hermetic in the range of binder compositions shown in FIG. 10.

It is also known that the strength of composite materials like the ceramics according to the present invention is generally much dependent on the difference in a coefficient of thermal expansion between the matrix and the binder, besides on the above-mentioned pores remaining in the composite materials. When the coefficient of thermal expansion of the matrix is much larger than that of the binder, high tension is exerted on the binder in the cooling stage after sintering. This internal stress causes a marked decrease in the strength of the entire composite material.

Considering the strength of the ceramics according to the present invention in the light of the above mentioned mechanism of decreasing the strength, the coefficient of thermal expansion of the present binder is believed to be considerably close to that of the matrix mullite. This is due to the noncrystalline structure of the binder used in the present invention and is a natural consequence in consideration also of the foregoing example of cordierite, which indicates that the coefficient of thermal expansion of a noncrystalline substance is considerably larger than that of the crystalline substance.

Finally, explanation is made on the results of tests for the ceramic-conductor metal junction, i.e., the metallized bond strength, which is an essential requirement for circuit substrates.

Since no chemical reaction occurs between ceramic mullite and either tungsten or molybdenum even at such a high temperature as 1650° C. (in a reducing atmosphere) as stated before, some amount of a liquid phase is necessary, in other words, the liquid phase penetration mechanism must be utilized, in order to join these materials firmly.

Usually, multilayer circuit substrates have a structure in which ceramic insulative layers and conductor metal layers are superposed alternately one upon another. For substrates of such a structure, it is ideal that the composition of the liquid phase for joining the ceramic to the conductor metal is identical with the composition of the binder for sintering the ceramic densely. The foregoing results shown in FIGS. 3 and 4 reveal that the binder according to the present invention has a sufficient wettability for both mullite and tungsten or molybdenum. Green sheets of ceramics were prepared from mixtures of mullite and 28 wt. %, based on the mullite, each of binders having the same compositions as shown in FIG. 4. Marks of 2 mm square were printed on these green sheets with each of tungsten and molybdenum conductor pastes. The resulting sheets were sintered at 1630° C. for 2 hours to prepare specimens. These specimens were measured for the strength of metallized bonds. The bond strengths were 1.5 to 5 kgs for tungsten and 1.0 to 4.0 kgs for molybdenum.

The metallized bond strength of circuit substrates is generally desired to at least 1 kg. Hence, the ceramics according to the present invention are found to be sufficient for practical use. The above-mentioned high metallized bond strength is caused by nothing but the molten binder, according to the present invention, which has a small contact angle on mullite as well as on tungsten and molybdenum metals, thus fully exhibiting the liquid phase penetrating effect.

The used paste is composed of a high-melting metal such as tungsten or molybdenum, solvent, and organic vehicle. The mixing proportions of these three components vary somewhat depending upon the desired conductivity. Generally the proportions are 70 to 85 wt. % of the high-melting metal, 10 to 29 wt. % of a solvent, and 1 to 5 wt. % of an organic vehicle. Desirably the high-melting metal has an average particle size of 0.5 to 2.0 μm and a purity of at least 99.9%.

The capability of sintering simultaneously the ceramic insulator and the conductor is of great advantage in controlling a process for fabrication of electronic computer circuit substrates to be used for multilayer wiring, and in reducing production costs.

EXAMPLE 2

Figure 11:
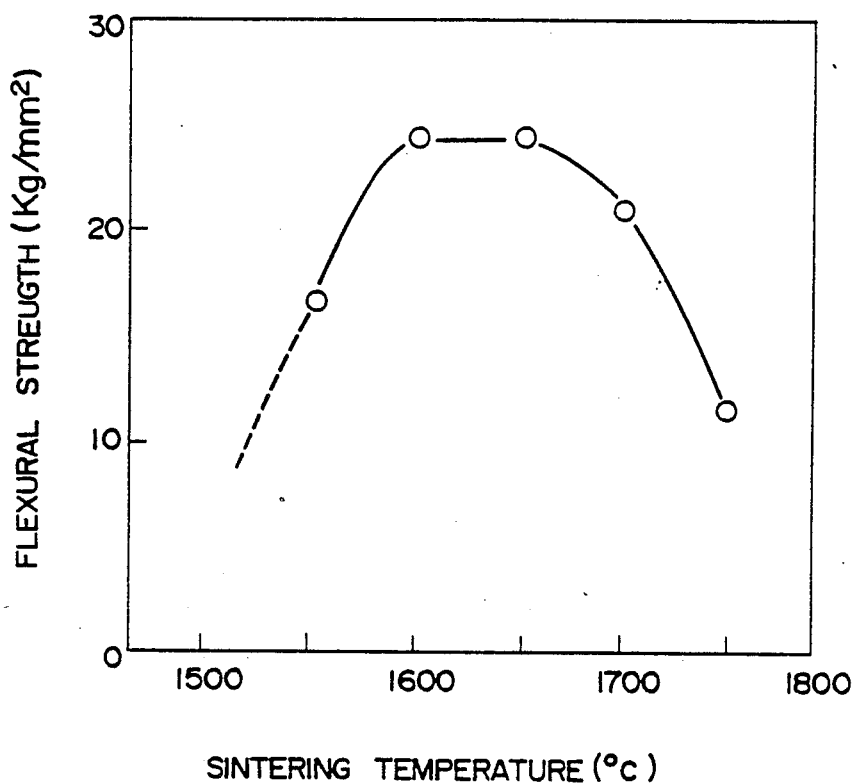
FIG. 11 shows the relation of a sintering temperature to a flexural strength for a mullite-binder composition.

FIG. 11 shows the relation between flexural strength and sintering temperature examined on a mullite-based ceramic. Test specimens were prepared from a mixture of 80 wt. % of mullite and 20 wt. % of a binder composed of 90 wt. % of $SiO_2$, 7 wt. % of $Al_2O_3$, and 3.0 wt. % of MgO. The specimens were sintered at different temperatures for 60 minutes in a reducing atmosphere.

As is seen from FIG. 11, ceramics according to the present invention sintered at a temperature of 1550° to 1700° C. have a flexural strength of at least 15 kg/mm$^2$ which is required by circuit substrates. Preferred sintering temperatures is from 1600° to 1700° C. These results are also connected to the binder-wettability of mullite and the like. It is a matter of course that the above suitable range of sintering temperatures is restricted by the melting temperature of a binder having the compositions as shown in FIG. 2 and by the contact angle of the binder on mullite at various temperatures.

EXAMPLE 3

Explanation is made below on the circuit substrates of the present invention, fabricated by the green-sheet lamination method.

A commercial mullite powder having an average particle size of 2 μm and a binder powder (having a particle size of 1–3 μm) composed of 60 wt. % of $SiO_2$, 30 wt. % of $Al_2O_3$, 10 wt. % of MgO are thoroughly mixed in respective proportions of 70 wt. % and 30 wt. % by means of a wet type ball mill. An organic binder, plasticizer and dispersion medium are added as compacting aids. The organic binder is polyvinyl butyral, acrylic ester or the like; the plasticizer is phthalic ester or the like; the dispersion medium is alcohol, trichloroethylene or the like.

The slurry obtained by addition of these compacting aids is compacted by, for example, the doctor blade method. This method is carried out by coating a slurry to a uniform thickness on a base film (carrier tape), drying the coat to solid, and separating the solid coat from the base film to yield a raw material sheet for ceramics, usually called a green sheet.

The thickness of the mullite-based sheets prepared in the above method is from 0.15 to 0.25 mm so as to meet the dielectric constants required for circuit substrates. Then holes are formed by punching or other suitable ways through the green sheets for the purpose of later wiring through the multilayer substrates. These through holes are filled with a tungsten paste prepared by adding a resin and a solvent to a tungsten metal powder having an average particle size of 1 μm. The tungsten paste used herein is composed of, for example, 77.5 wt. % of a tungsten powder (a purity of at least 99.9% and average particle size of 1±0.5 μm), 20 wt. % of diethylene glycol mono-n-butyl ether acetate, 2.0 wt. % of ethyl cellulose, and 0.5 wt. % of polyvinyl butyral.

Then, intended patterns are printed with a similar tungsten paste on the green sheets for wiring of outermost circuit layers and inner circuit layers. Molybdenum also may be used in place of tungsten for the paste.

20 ceramic green sheets thus wired are super-posed one upon another, and hot-pressed under a pressure of about 50 kg/cm$^2$ at 110° C. to form a laminate of ceramic green sheets. This laminated body is sintered at 1580° C. for 5 hours in a humidified atmosphere of hydrogen to yield mullite-based multilayer circuit substrates wired with tungsten conductor.

Figure 12:
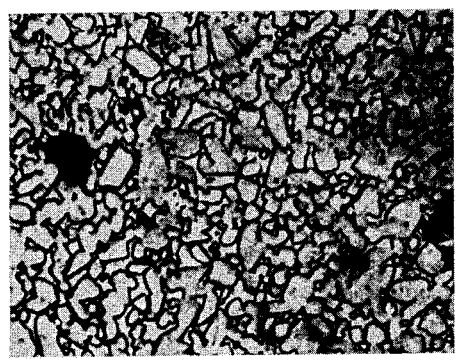
FIG. 12 is a microscopic photograph showing the fine structure of a ceramic substrate according to the present invention.

The obtained circuit substrates exhibited a water absorption of zero %, coefficient of thermal expansion of $5.4 \times 10^{-6}$/°C., dielectric constant of 6.1, and flexural strength of 20 kg/mm$^2$. Cross sections of the substrates were observed with a microscope to examine the fine structure. As shown in FIG. 12, these substrates were found to have a structure in which mullite particles are surrounded with the binder. The characteristic and effect of the present invention were confirmed readily from FIG. 12.

EXAMPLE 4

Multilayer circuit substrates were prepared in the same manner as in Example 3 by forming green sheets from a mixture of 80 wt. % of mullite (the same powder as used in Example 3) and 20 wt. % of a binder ($SiO_2$ 90 wt. %, $Al_2O_3$ 7.0 wt. %, MgO 3.0 wt. %), forming through holes and circuit patterns, laminating 25 resulting sheets, and sintering the laminate at 1620° C. for 2 hours in a humidified atmosphere of hydrogen.

Figure 13:
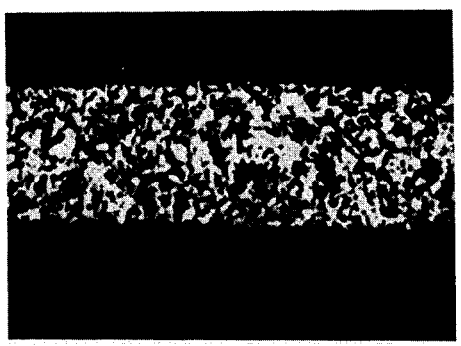
FIG. 13 is a microscopic photograph showing the fine structure of a ceramic substrate-W conductor junction according to the present invention.

The obtained substrates exhibited a water absorption of zero %, coefficient of thermal expansion of $5.2 \times 10^{-6}$/°C., dielectric constant of 5.9, and flexural strength of 25 kg/mm$^2$. Cross sections of these substrates were observed with a microscope to examine internal wiring between the substrate layers It was confirmed therefrom that the ceramic layers and conductor metal layers were united completely as shown in FIG. 13. This completely united state results from the densification of mullite being performed in the sintering step by the binder added and from the tungsten layers being penetrated sufficiently with the binder.

EXAMPLE 5

Multilayer circuit substrates were prepared in the same manner as in Example 3 by forming green sheets from a mixture of 85 wt. % of mullite (the same powder as used in Example 3) and 15 wt. % of a binder ($SiO_2$ 93 wt. %, $Al_2O_3$ 4 wt. %, MgO 1 wt. %, forming through holes and circuit patterns, laminating 18 resulting sintering the laminate at 1660° C. for 1 hour in a humidified atmosphere of hydrogen.

The obtained substrates exhibited a water absorption of zero %, coefficient of thermal expansion of $4.6 \times 10^{-6}$/°C., dielectric constant of 5.7, and flexural strength of 21 kg/mm$^2$. Input and output terminals of Kovar metal were fixed with a brazing material on the upper surface of the substrates and a tensile test was conducted so as to apply stress between the substrate and each terminal. The result showed that all breaks occurred within the ceramic substrate and the mode of breaks was similar to that of usual alumina substrates. This indicates that the substrates of this example are sufficient for practical use.

According to the present invention, it is possible to produce circuit substrates which are dense and superior in thermal and electrical properties ot conventional alumina substrates, that is, have very low coefficients of thermal expansion of 4.5 to $5.5 \times 10^{-6}$/°C. and very low dielectric constants of 5.5 to 6.2, additionally have sufficient flexural strengths of 15 to 25 kg/mm$^2$, and can be sintered simultaneously with a conductor metal such as W and Mo for wiring to be united therewith into a single body. Therefore, the present substrates have such distinct effects that the signal propagation speed can be increased by at least 25% as compared with conventional alumina sustrates, reliability also is hightened at the junctions between the substrate and the Si chip and between the substrate and either of input and output terminals, the economy is made better, and the process is stabilized.

We claim:

1. A ceramic substrate which comprises a sintered body composed substantially of 70 to 85% by weight of mullite crystals and 30 to 15% by weight of a noncrystalline binder; said binder comprising 60 to 95% by weight of $SiO_2$, 4 to 30% by weight of $Al_2O_3$, and 1 to 10% by weight of MgO.

2. The ceramic substrate according to claim 1, on which a wiring conductor of high-melting metal is provided.

3. The ceramic substrate according to claim 2 through which holes are formed and filled with the same conductor as said wiring conductor.

4. The ceramic substrate according to claim 2, wherein said high-melting metal is tungsten or molybdenum.

* * * * *